United States Patent
Luedeke et al.

(10) Patent No.: US 7,602,187 B2
(45) Date of Patent: Oct. 13, 2009

(54) INTEGRATED POWER SUPPLY FOR SURFACE COILS

(75) Inventors: Kai-Michael Luedeke, Hamburg (DE); Christian Findeklee, Hamburg (DE); Peter H. Notten, Eindhoven (NL); Marinus J. A. M. van Helvoort, Best (NL); Hans H. Tuithof, Best (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 338 days.

(21) Appl. No.: 11/570,893

(22) PCT Filed: Jun. 7, 2005

(86) PCT No.: PCT/IB2005/051857

§ 371 (c)(1), (2), (4) Date: Dec. 19, 2006

(87) PCT Pub. No.: WO2006/000928

PCT Pub. Date: Jan. 5, 2006

(65) Prior Publication Data

US 2008/0272786 A1      Nov. 6, 2008

Related U.S. Application Data

(60) Provisional application No. 60/582,783, filed on Jun. 25, 2004.

(51) Int. Cl.
*G01V 3/00* (2006.01)
(52) U.S. Cl. .................................. 324/318; 324/322
(58) Field of Classification Search ......... 324/300–322; 600/407–445
See application file for complete search history.

(56) References Cited

U.S. PATENT DOCUMENTS

| 4,792,760 | A | * | 12/1988 | Jacob et al. | 324/322 |
| 5,280,249 | A |   | 1/1994  | Kess         |         |
| 5,473,252 | A | * | 12/1995 | Renz et al.  | 324/318 |
| 5,491,415 | A | * | 2/1996  | Holmes et al.| 324/322 |
| 5,501,921 | A |   | 3/1996  | Olsen        |         |
| 5,744,957 | A |   | 4/1998  | Vaughan      |         |
| 6,020,740 | A |   | 2/2000  | Renz et al.  |         |
| 6,034,576 | A | * | 3/2000  | Kuth         | 333/101 |

(Continued)

FOREIGN PATENT DOCUMENTS

DE      196 40 463 A1      10/1997

(Continued)

OTHER PUBLICATIONS

Rubinson, K. A., et al.; A Novel Topical Probe for MRI: The Flat, Truncated Line Probe; 1995; Magnetic Resonance Imaging; 13(2)301-308.

*Primary Examiner*—Brij B Shrivastav

(57) ABSTRACT

A radio frequency receive coil for receiving a magnetic resonance signal includes a radio frequency antenna. The radio frequency antenna includes one or more electrical conductors (72, 74, 76, 78, 172, 173, 176, 180, 252, 254), at least one of which is a substantially hollow conductor (72, 78, 172, 252, 254). At least one electrical component (100, 110, 110', 110", 140, 160, 200) is mounted to be shielded from interfering with the MR signal by disposing it inside the substantially hollow conductor. The at least one electrical component can be, for example, a battery (100, 160, 200), a storage capacitor (140), or coil electronics (110, 110', 110").

18 Claims, 9 Drawing Sheets

U.S. PATENT DOCUMENTS

| | | |
|---|---|---|
| 6,273,904 B1 * | 8/2001 | Chen et al. .................... 607/88 |
| 6,362,622 B1 * | 3/2002 | Stauber et al. .............. 324/318 |
| 6,406,816 B2 | 6/2002 | Hikmet |
| 6,444,368 B1 | 9/2002 | Hikmet et al. |
| 6,542,768 B1 | 4/2003 | Kuth et al. |
| 6,545,475 B2 * | 4/2003 | Kroeckel et al. ............ 324/318 |
| 6,922,591 B2 * | 7/2005 | Single ......................... 607/57 |
| 2003/0001574 A1 | 1/2003 | Kroeckel et al. |
| 2003/0165744 A1 | 9/2003 | Schubert et al. |
| 2003/0206019 A1 | 11/2003 | Boskamp |
| 2003/0231106 A1 | 12/2003 | Shafer |

FOREIGN PATENT DOCUMENTS

| | | |
|---|---|---|
| EP | 0 317 090 A2 | 5/1989 |
| WO | 03 107505 A2 | 12/2003 |
| WO | 03 107506 A2 | 12/2003 |

* cited by examiner

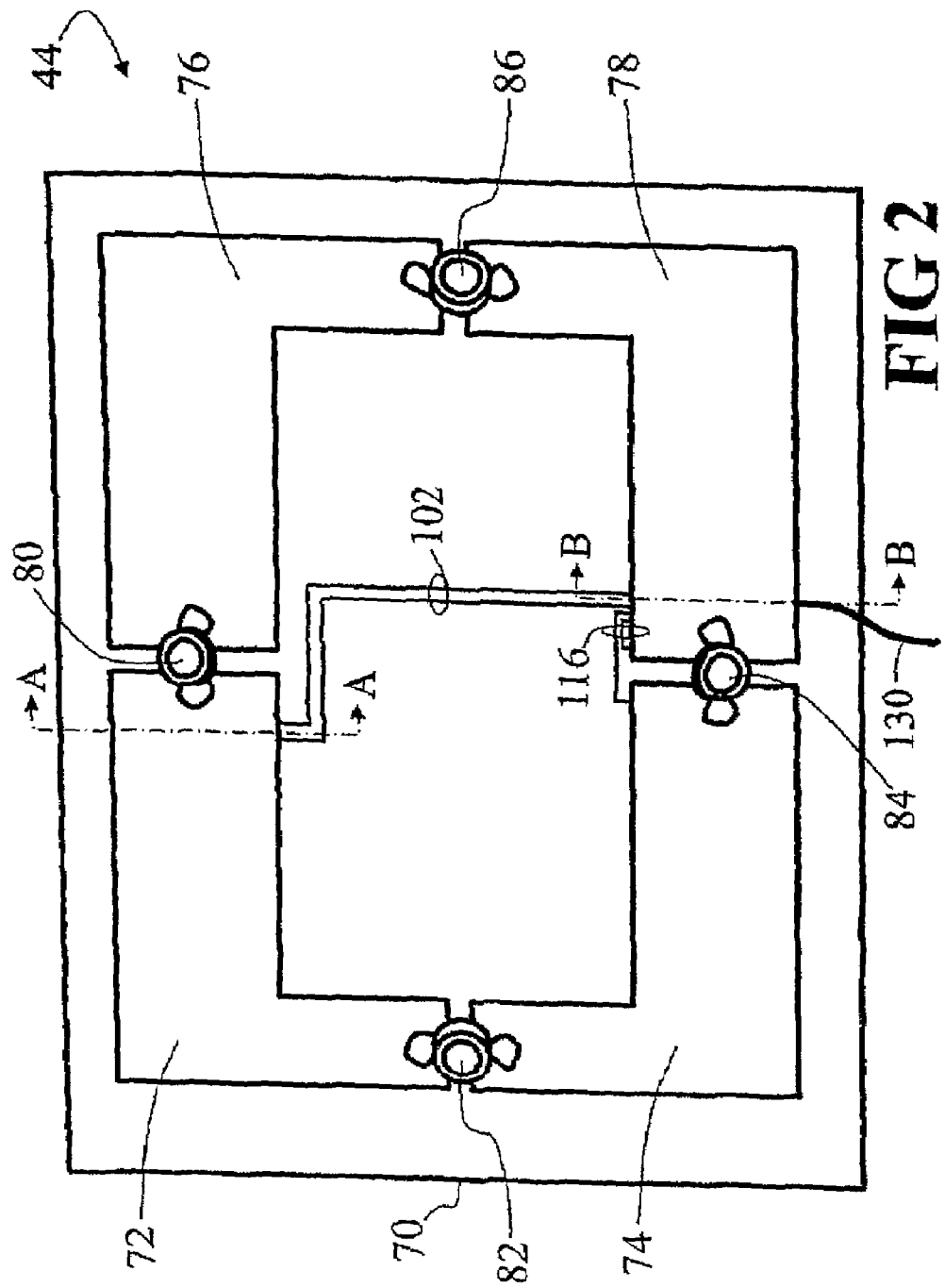

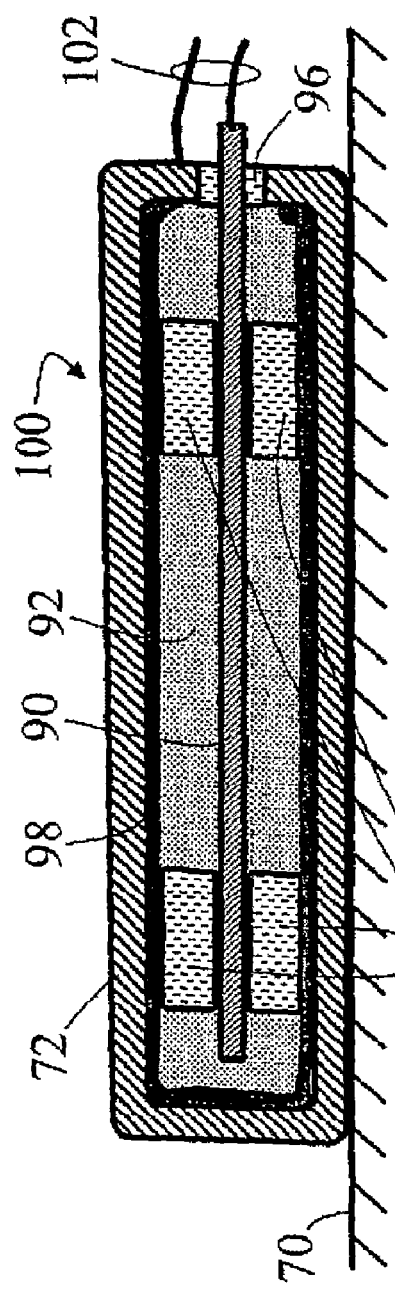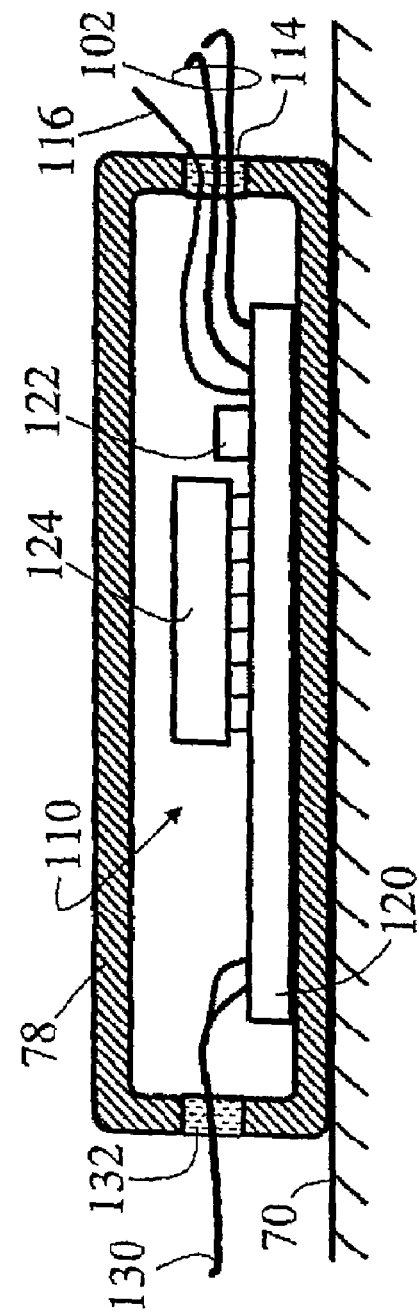

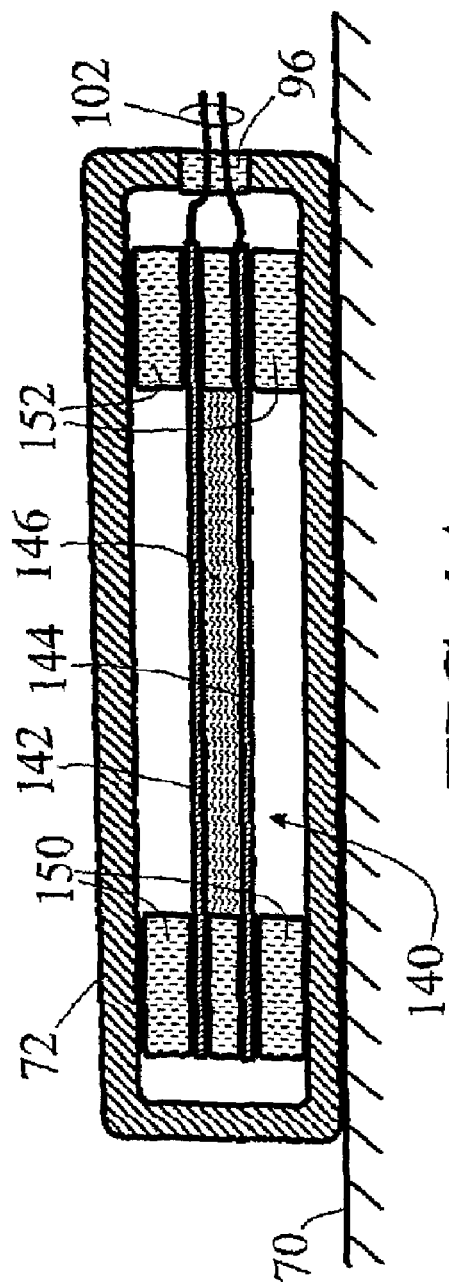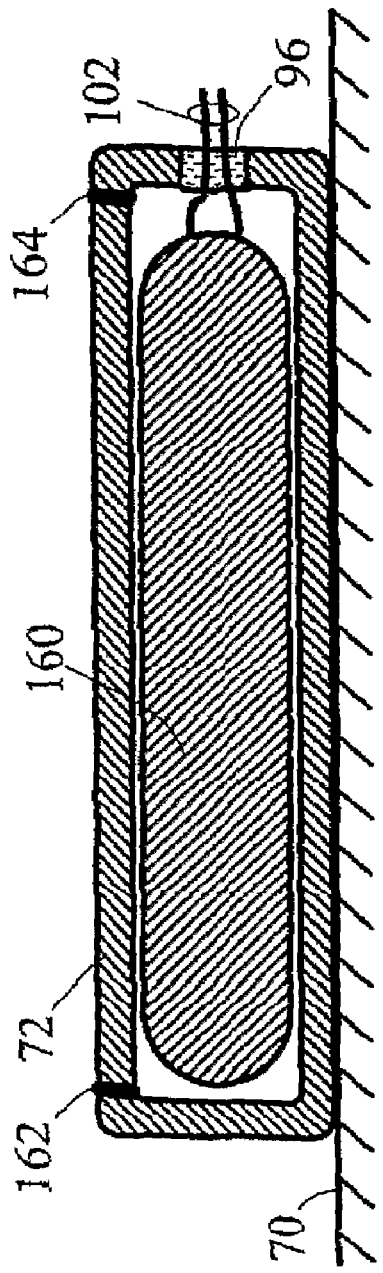

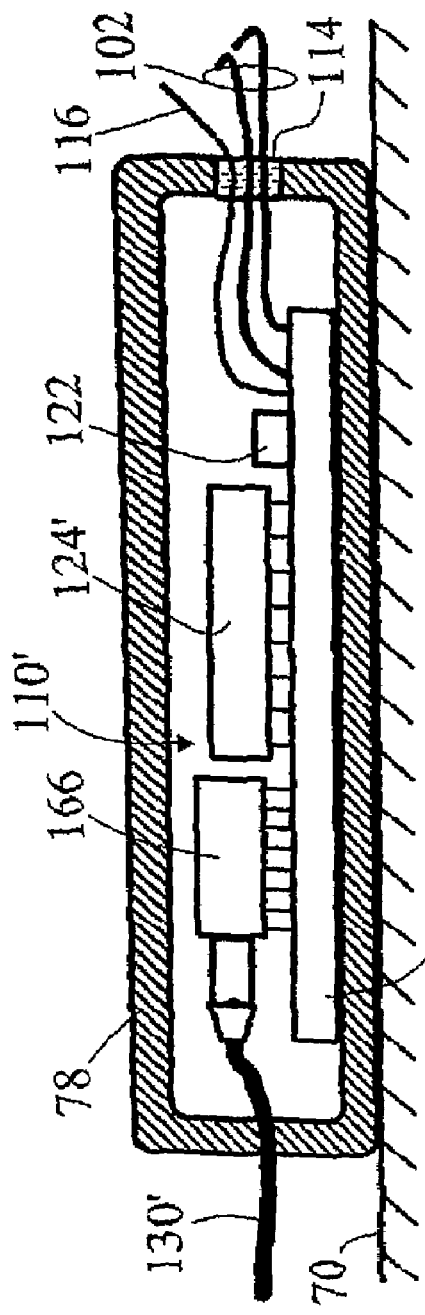
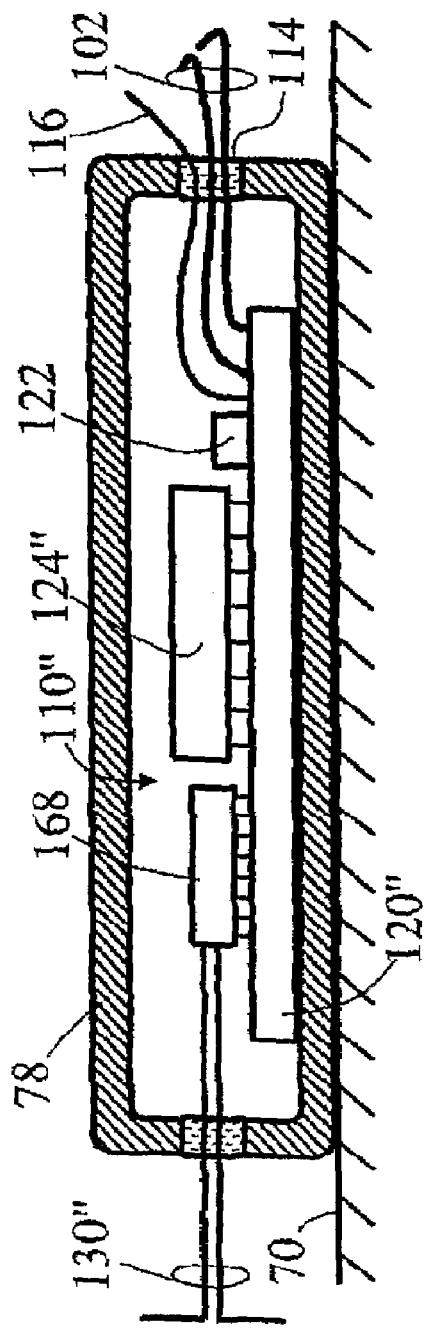
FIG 5A
FIG 5B

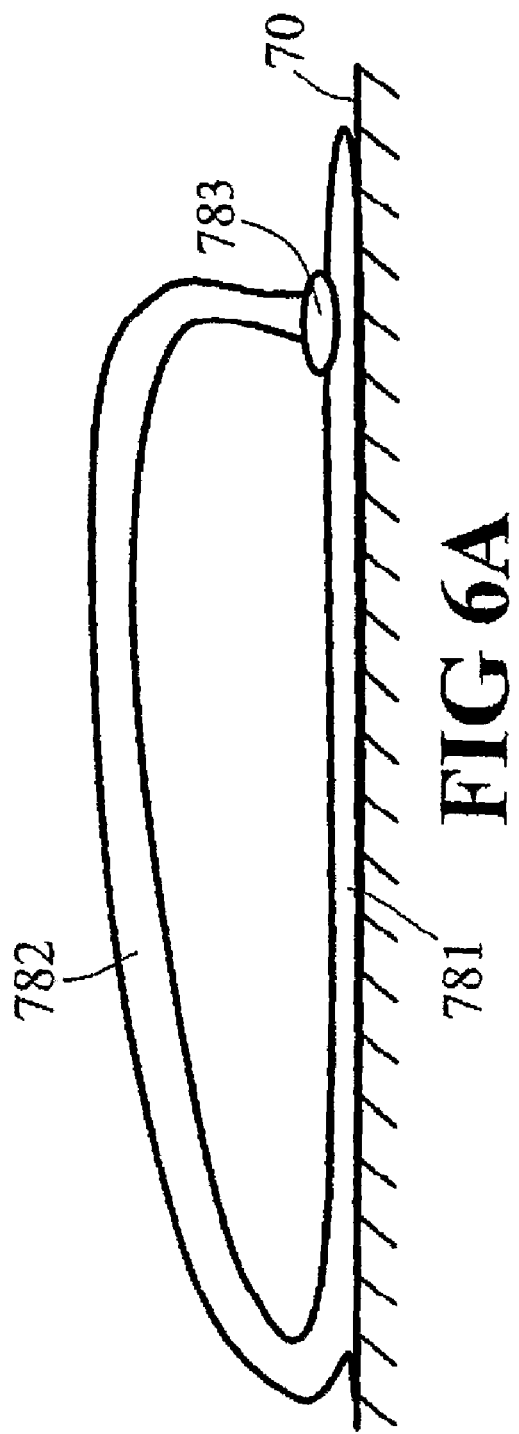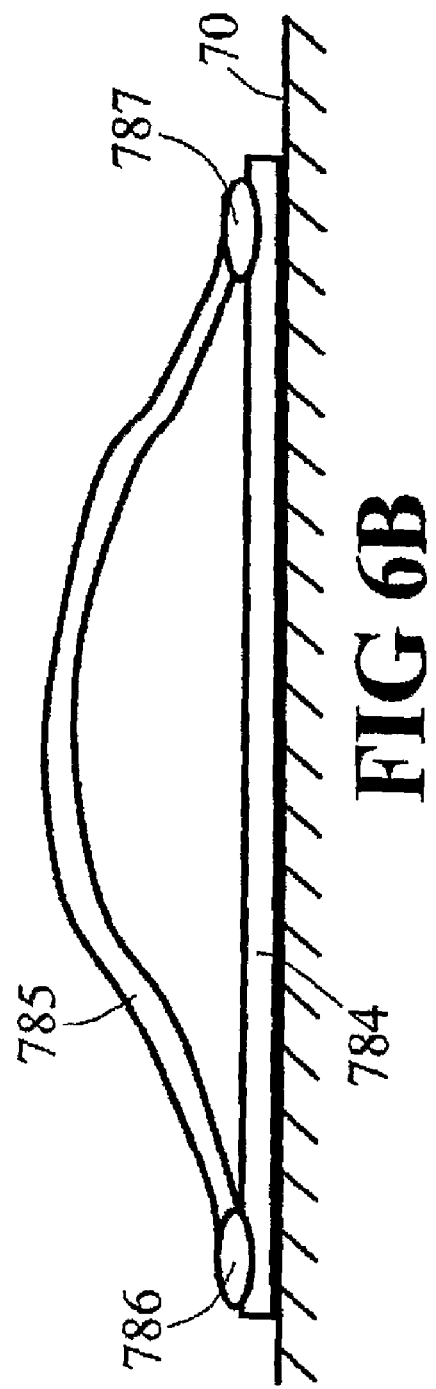

INTEGRATED POWER SUPPLY FOR SURFACE COILS

CROSS REFERENCE TO RELATED APPLICATIONS

This application claims the benefit of U.S. provisional application Ser. No. 60/582,783 filed Jun. 25, 2004, which is incorporated herein by reference.

The following relates to the magnetic resonance arts. It finds particular application in surface receive coils for magnetic resonance imaging, and will be described with particular reference thereto. However, it also finds application in head coils, birdcage coils, and other local radio frequency receive and transmit coils used in magnetic resonance imaging, magnetic resonance spectroscopy, and the like.

Local radio frequency receive coils provide a magnetic resonance signal pickup that can be disposed in close proximity to the region being imaged. A surface coil or array of surface coils, for example, can be placed in contact with or in close proximity to an anatomical feature that is being imaged, thus providing good radio frequency coupling with the magnetic resonance signal emanating from the imaged region. Similarly, a head coil can be placed over the subject's head for improved RF coupling during brain imaging. The local coil generally includes coil electronics for signal processing, noise filtering, pre-amplification of the received magnetic resonance signal, or so forth. These coil electronics generally require electrical power for operation.

Heretofore, electrical power for operating the coil electronics has usually been supplied from a remote power supply via electrical power leads entering the magnetic resonance scanner bore and connecting with the local coil. However, such extended power leads can present a safety issue during the transmit phase of a magnetic resonance imaging sequence. This is because the power leads are low impedance leads, and can support standing waves induced by the radio frequency excitation. The standing waves, in turn, can produce substantial heating of the power leads.

Another problem with existing surface coils is that the coil electronics, which are generally shielded by a Faraday shield, occupy space on the coil support and can distort the radio frequency characteristics of the coil. Typically, the electronics are disposed on the surface coil at some distance away from the radio frequency antenna to reduce problematic sensitivity pattern distortion. This arrangement involves a tradeoff: as the electronics are moved closer to the coil radio frequency distortion increases; but, as the electronics are moved further away from the coil, the area of the surface coil increases. Increasing coil area is particularly problematic in the case of coil arrays which are closely packed.

The present invention contemplates improved apparatuses and methods that overcomes the aforementioned limitations and others.

According to one aspect, a radio frequency receive coil is disclosed for receiving a magnetic resonance signal. A radio frequency antenna includes one or more electrical conductors, at least one of which is a substantially hollow conductor. At least one electrical component is disposed inside the substantially hollow conductor.

According to another aspect, a radio frequency receive coil is disclosed for receiving a magnetic resonance signal. A radio frequency antenna includes one or more electrical conductors. Electronics are disposed with the radio frequency antenna for operating the radio frequency antenna. At least one battery is disposed on or in one of the electrical conductors. The at least one battery supplies electrical power driving the electronics.

According to yet another aspect, a magnetic resonance imaging scanner is disclosed for imaging an imaging subject. A main magnet generates a substantially spatially and temporally constant magnetic field in an examination region. Magnetic field gradient coils generate selected magnetic field gradients in the examination region. A radio frequency receive coil includes (i) one or more electrical conductors at least one of which is a substantially hollow conductor, and (ii) at least one electrical component disposed inside the at least one substantially hollow conductor.

One advantage resides in elimination of extended power supply input leads of a radio frequency coil, and elimination of attendant safety concerns of such leads in a magnetic resonance imaging scanner.

Another advantage resides in reduction of radio frequency distortion due to separately shielded coil electronics.

Yet another advantage resides in providing a wireless local coil.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system including a radio frequency surface coil for receiving a magnetic resonance signal.

FIG. 2 shows a top view of the surface coil of FIG. 1.

FIG. 3A shows cross-section A-A of the coil of FIG. 2, which sections the substantially hollow electrical conductor of the coil containing an integral battery.

FIG. 3B shows cross-section B-B of the coil of FIG. 2, which sections the substantially hollow electrical conductor of the coil containing coil electronics.

FIG. 4A shows an alternative cross-section along section A-A of the coil of FIG. 2, in which the integral battery is replaced by a capacitor power supply.

FIG. 4B shows an alternative cross-section along section A-A of the coil of FIG. 2, in which the integral battery is replaced by a battery pack.

FIG. 5A shows an alternative cross-section along section B-B of the coil of FIG. 2, in which the coil electronics produce a fiber optic output.

FIG. 5B shows an alternative cross-section along section B-B of the coil of FIG. 2, in which the coil electronics produce a wireless output.

FIG. 6A shows one approach for fabricating one of the substantially hollow conductors of FIG. 2.

FIG. 6B shows another approach for fabricating one of the substantially hollow conductors of FIG. 2.

Figure 1:
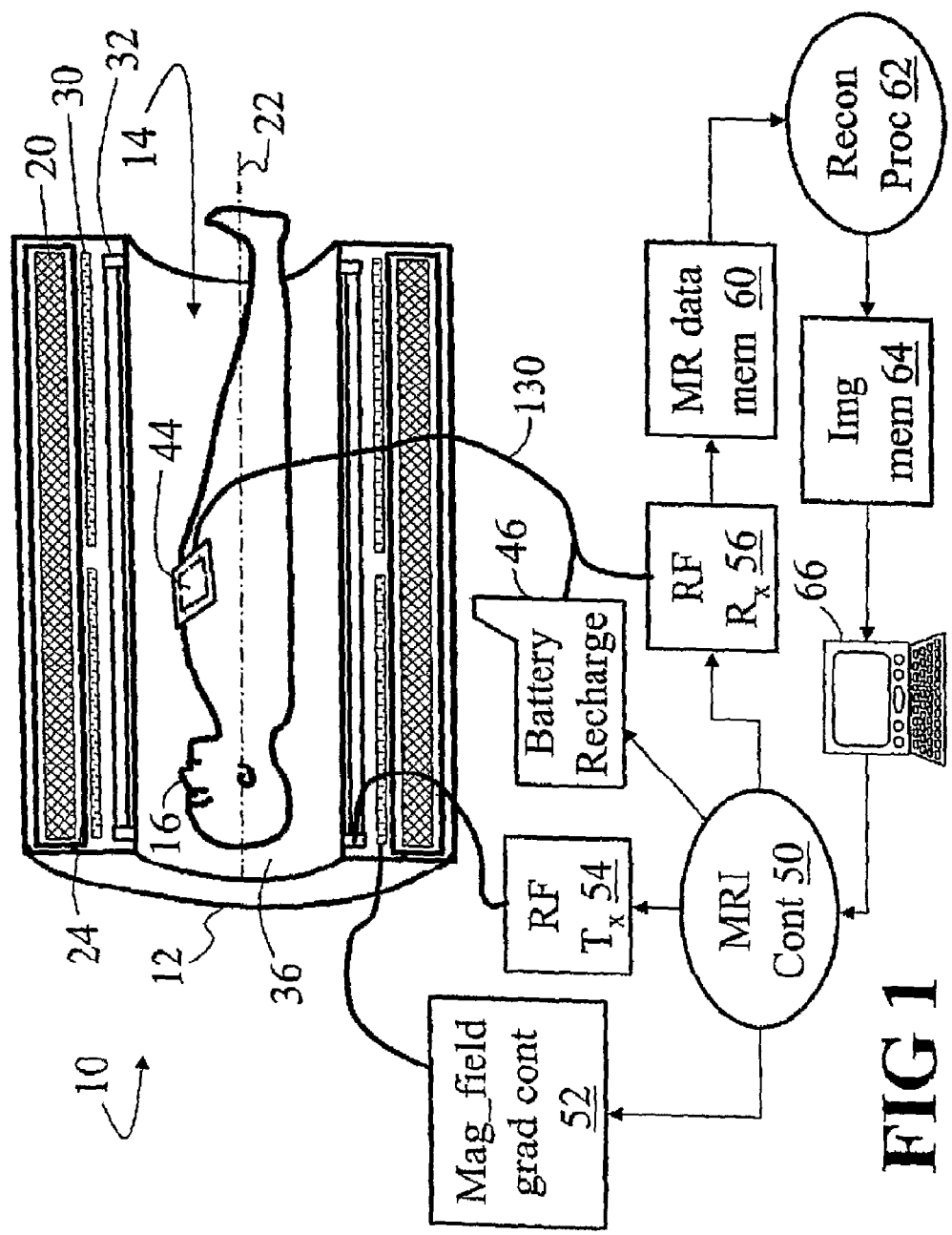

With reference to FIG. 1, a magnetic resonance imaging scanner 10 includes a housing 12 defining a generally cylindrical scanner bore 14 inside of which an associated imaging subject 16 is disposed. Main magnetic field coils 20 are disposed inside the housing 12, and produce a main $B_0$ magnetic field directed generally parallel with a central axis 22 of the scanner bore 14. The main magnetic field coils 20 are typically superconducting coils disposed inside cryoshrouding 24, although resistive main magnets can also be used. The housing 12 also houses or supports magnetic field gradient coils 30 for selectively producing magnetic field gradients in the bore 14. The housing 12 further houses or supports a radio frequency body coil 32 for selectively exciting magnetic resonances. The housing 12 typically includes a cosmetic inner liner 36 defining the scanner bore 14.

A battery-powered radio frequency surface coil 44 is disposed inside the bore 14 close to or in contact with the imaging subject 16. A recharging stand 46 is disposed outside the bore 14 to recharge the battery of the surface coil 44. While a single surface coil 44 is shown, in some applications a plurality of surface coils are employed, for example to define a phased array of receivers for parallel imaging, a sensitivity encoding (SENSE) coil array for acquiring SENSE imaging data, or the like. The main magnetic field coils 20 produce a main $B_0$ magnetic field. A magnetic resonance imaging controller 50 operates magnetic field gradient controllers 52 to selectively energize the magnetic field gradient coils 30, and operates a radio frequency transmitter 54 coupled to the radio frequency coil 32 to selectively inject radio frequency excitation pulses into the imaging subject 16.

By selectively operating the magnetic field gradient coils 30 and the radio frequency coil 32, magnetic resonance is generated and spatially encoded in at least a portion of a region of interest of the imaging subject 16. By applying selected magnetic field gradients via the gradient coils 30, a selected k-space trajectory is traversed, such as a Cartesian trajectory, a plurality of radial trajectories, or a spiral trajectory. During imaging data acquisition, the magnetic resonance imaging controller 50 operates a radio frequency receiver 56 coupled to the radio frequency receive coil 44, or to an array of similar local coils, to acquire magnetic resonance samples that are stored in a magnetic resonance data memory 60.

The acquired imaging data are reconstructed by a reconstruction processor 62 into an image representation. In the case of k-space sampling data, a Fourier transform-based reconstruction algorithm can be employed. Other reconstruction algorithms, such as a filtered backprojection-based reconstruction, can also be used depending upon the format of the acquired magnetic resonance imaging data. The reconstructed image or images generated by the reconstruction processor 62 are stored in an images memory 64, and can be displayed on a user interface 66, stored in non-volatile memory, transmitted over a local intranet or the Internet, viewed, stored, manipulated, or so forth. The user interface 66 also preferably enables a radiologist, technician, or other operator of the magnetic resonance imaging scanner 10 to communicate with the magnetic resonance imaging controller 50 to select, modify, and execute magnetic resonance imaging sequences.

The described magnetic resonance imaging system is an illustrative example only. The radio frequency receive coils described herein can be used with substantially any type of magnetic resonance imaging scanner, including but not limited to horizontal bore scanners, vertical bore scanners, open magnet scanners, and so forth. Moreover, the radio frequency receive coils described herein can be combined to define arrays of receive coils for parallel imaging, SENSE imaging, and the like.

With reference to FIG. 2, the surface coil 44 includes a generally planar insulating substrate 70 on which are disposed one or more electrical conductors 72, 74, 76, 78. In the illustrated surface coil 44, capacitances 80, 82, 84, 86 connect neighboring pairs of the electrical conductors 72, 74, 76, 78 to form a rectangular radio frequency antenna. Other reactances, conductors, or a direct ohmic connection between the conductors, can be employed depending upon the radio frequency characteristics desired. Moreover, other radio frequency antenna configurations can also be employed, such as a circular antenna, an array of antenna loops, double-D, saddle coils, or the like.

With continuing reference to FIG. 2 and with further reference to FIG. 3A, the electrical conductor 72 is a substantially hollow conductor inside of which is disposed a first electrode 90 and an electrolyte 92. The first electrode 90 is spaced apart from the substantially hollow electrical conductor 72 by electrically insulating standoffs 94 and by an electrically insulated feed-through 96. An electrical storage battery 100 includes the first electrode 90, the electrolyte 92, and a second electrode 98 coating the substantially hollow conductor 72. Electrical leads 102 contact the first electrode 90, and contact the second electrode 98 via the hollow conductor 72.

While FIG. 3A illustrates an example embodiment in which the second electrode is supported by and coats the substantially hollow conductor 72, in other embodiments a physically separate second electrode may be provided. Conversely, if the substantially hollow conductor 72 is made of a suitable electrode material, then the coating electrode 98 can be omitted and the substantially hollow conductor 72 serves as the second electrode.

Moreover, the discrete standoffs 94 are in some embodiments replaced by a more continuous porous spacer, with the electrolyte 92 drenched or infused into the porous spacer. In embodiments combining a continuous spacer with two separate electrodes (as opposed to having one electrode 98 coating surfaces of the substantially hollow electrical conductor 72), the electrodes can be rolled or wound up into a cylindrical, prismatic, or other shape to provide a higher electrodes surface area-to-volume ratio. One or both electrodes can also be porous to increase the electrode surface area.

In one preferred embodiment, the battery 100 of FIG. 3A is a lithium-polymer battery (sometimes also called a Li-poly battery) in which the electrolyte 92 is a polymer gel having a semi-solid, jelly-like consistency. Alternatively, a solid or liquid electrolyte can be used. The battery electrodes and electrolyte should be made of non-magnetic materials. In some embodiments, the battery 100 is a lithium-ion battery containing a graphite electrode and a lithium cobalt oxide electrode. Optionally, the cobalt oxide electrode, which may be non-magnetic, is replaced by a manganese oxide electrode which is definitely non-magnetic. It is also contemplated to replace the lithium electrode by silicon to increase the energy capacity, or to replace the lithium electrode by magnesium. In other embodiments, the battery 100 is a nickel-metal halide battery containing a nickel hydroxide electrode and a metal hydride electrode. For example, the metal hydride material can be a non-magnetic magnesium hydride electrode.

The battery 100 of FIG. 3A is an example only; those skilled in the art can make modifications to increase battery output voltage or to modify other battery characteristics. Such modification may include, but are not limited to: employing plurality of first electrodes interconnected in series or parallel; including serpentine, rolled-up, porous, or other higher surface area electrodes; roughening the surfaces of the electrodes to increase its surface area; and so forth. In preferred embodiments, the battery 100 is a rechargeable battery. In other embodiments, the battery 100 is non-rechargeable, but is instead replaced when substantially discharged by replacing the battery unit including the substantially hollow electrical conductor 72, the first electrode 90, and the contained electrolyte 92.

With continuing reference to FIG. 2 and with further reference to FIG. 3B, the electrical leads 102 connect the battery 100 of the substantially hollow electrical conductor 72 to coil electronics 110 disposed inside the electrical conductor 78, which is also a substantially hollow electrical conductor. As seen in FIG. 2, the leads 102 include printed circuit traces disposed on the printed circuit board 70. The electrical leads 102 enter the substantially hollow electrical conductor 78 through an electrically insulated electrical feed-through 114.

Additionally, the received magnetic resonance signal, which is acquired principally on the outside surface of the electrical conductors 72, 74, 76, 78, is ported to the coil electronics 110 disposed inside the electrical conductor 78 by one or more RF porting electrical wires, coaxial cables, or other electrical conductors 116. In some embodiments, the conductors 116 connect across one of the capacitors 80, 82, 84, 86. For example, FIG. 1 shows connection of the conductors 116 across the capacitor 84. This is only an example; those skilled in the art can readily provide RF connections to implement a selected two-point, four-point, or other RF signal porting scheme.

Optionally, the battery and the electronics can be housed in separate portions of the same conductor section. However, in such a case the electrolyte should be kept electrically isolated from the electronics. This is usually most readily achieved by keeping the electronics and the electrolyte physically separated.

Advantageously, the substantially hollow electrical conductor 78 acts as a Faraday shield to shield the coil electronics 110 from electromagnetic interference. Thus, separate shielding is not necessary for the coil electronics 110. This is advantageous because separate coil electronics shielding can produce magnetic flux expulsion, eddy currents, or effects that distort the coil's sensitivity pattern.

The coil electronics 110 are suitably disposed on an insulated printed circuit board 120 secured to an inside surface of the substantially hollow electrical conductor 78. Alternatively, an electrically conductive printed circuit board, such as a metal core printed circuit board, can be mounted inside the substantially hollow electrical conductor 78 using insulating standoffs. In the illustrated example, a reactive choke 122 suppresses radio frequency signal components from the electrical power received from the battery via the electrical leads 102, and the filtered power is used to drive an application specific integrated circuit (ASIC) 124 that embodies the electrical components. The ASIC 124 is one example of a suitable coil electronics component—a programmed controller, microprocessor, FPGA, interconnected discrete electronic components, or the like can be substituted for the ASIC 124 or can be included in addition to the ASIC 124.

The coil electronics 110 may include, for example: a.c./d.c. or d.c./d.c. power conversion; a pre-amplifier with matching circuitry connected to the coil 44; radio frequency baluns, traps, or the like for suppressing induced currents; detuning circuitry for detuning the coil from the magnetic resonance frequency during the transmit phase of magnetic resonance imaging; safety interlock circuitry; remotely controllable tuning circuitry; recharging circuitry for the battery; state-of-charge circuitry for determining the battery charge state; and the like. The coil electronics 110 also output an output signal corresponding to the received magnetic resonance signal. In the embodiment illustrated in FIGS. 1 and 3B, the electronics 110 output a signal to an RF cable 130, which, is preferably a coaxial or triaxial cable, that exits the interior of the substantially hollow electrical conductor 78 via a second electrically insulated electrical feed-through 132, and connects with the radio frequency receiver 56 and optionally also with the battery recharger 46 to enable recharging of the battery.

While disposing miniaturized electronics inside of the hollow conductor provides shielding on all sides, it is also contemplated to dispose the electronics on a conductor of the coil. This arrangement of miniaturized electronics on a coil conductor provides single-sided shielding for the electronics, and facilitates short connecting conductive traces.

With reference to FIG. 4A, in an alternative embodiment the battery 100 of the substantially hollow electrical conductor 72 is a storage capacitor 140 disposed inside the substantially hollow electrical conductor 72. The storage capacitor 140 is a parallel plate capacitor including first and second conductive capacitor plates 142, 144 sandwiching a dielectric material 146. The storage capacitor 140 is spaced apart from the substantially hollow electrical conductor 72 by insulating standoffs 150, 152 and by the electrically insulated electrical feed-through 96. Although a parallel plate capacitor is shown, substantially any type of storage capacitor can be employed, such as a "can-type" rolled capacitor, an electrolytic capacitor, or so forth.

In some embodiments, the battery or storage capacitor is charged on the charger 46 before the surface coil 44 is used, and is recharged whenever the stored charge is substantially depleted. In other embodiments, the battery or storage capacitor is charged by the radio frequency excitation phase of the magnetic resonance imaging sequence, that is, the battery or capacitor is charged by the radio frequency transmitter 54 during magnetic resonance excitation. The battery or capacitor discharges through extraction of electrical power during the readout phase of the magnetic resonance imaging sequence. In yet another embodiment, the battery or capacitor is charged over the RF cable 130 between scans. In still yet other embodiments, charging is induced by magnetic field gradients using the magnetic field gradient coils 30, or another electromagnetic power transmission can be employed.

With reference to FIG. 4B, in yet another alternative embodiment the battery 100 of the substantially hollow electrical conductor 72 is a self-contained electrical storage battery 160 disposed inside the substantially hollow electrical conductor 72. The self-contained electrical storage battery 160 can be a lithium polymer storage battery, or can be substantially any other type of battery. In some embodiments, the battery 160 is rechargeable via the electrical leads 102. In other embodiments, the battery 160 is a disposable battery that is replaced when it is substantially discharged. To facilitate replacement of the battery 160 in these embodiments, the substantially hollow electrical conductor 72 includes a removable lid having edges 162, 164, or includes another access opening. In embodiments in which the battery 160 is disposable, the connection of the battery 160 to the electrical leads 102 may also involve an electrical connector (not shown) that can be decoupled during battery replacement. Typically, the self-contained electrical storage battery 160 includes an electrically insulating housing that isolates the battery 160 from the substantially hollow electrical conductor 72. Alternatively, insulating standoffs can be employed to space the battery 160 apart from the substantially hollow conductor 72.

With reference to FIGS. 5A and 5B, the conductive RF electrical coupling of the output signal of the coil electronics 110 can be replaced by an optical or wireless coupling. With specific reference to FIG. 5A, modified coil electronics 110' include an ASIC 124' that is substantially similar to the ASIC 124 of FIG. 3B, except that the ASIC 124' produces an output that drives an electro-optical component 166 to output a modulated optical signal corresponding to the received magnetic resonance signal. The electro-optical component 166 can, for example, be a light emitting diode or a semiconductor laser that is directly modulated or that is optically coupled with an optical modulator component. The electro-optical component 166 is coupled to an output optical fiber 130' that replaces the RF cable 130 of FIG. 3A.

With specific reference to FIG. 5B, modified coil electronics 110" include an ASIC 124" is substantially similar to the ASIC 124 of FIG. 3B, except that the ASIC 124" produces an output that drives a wireless transmitter component 168 to output a modulated radio frequency signal corresponding to the received magnetic resonance signal. The modulated output radio frequency signal is frequency-shifted away from the magnetic resonance frequency. The wireless transmitter component 168 can, for example, be a heterodyne mixer coupled with an intermediate frequency (IF) oscillator. The wireless transmitter component 168 is coupled to an output antenna 130" extending, outside of the substantially hollow electrical conductor 78. The output antenna 130" replaces the RF cable 130 of FIG. 3A. Optionally, the output antenna 130" can also function as an input antenna to receive recharging power, and/or can be used to receive operating instructions, such as a coil switching signal or an adaptive gain control (AGC) signal.

In wireless or optical transmission, the electronics ASIC 124', 124" or other electronics module optionally includes analog-to-digital conversion so that the wireless or optical transmitted signal is digital rather than analog. One suitable electronics embodiment for digital transmission includes a radio frequency pre-amplifier and an analog-to-digital converter. The pre-amplifier is preferably controllable such that the maximum range of the analog-to-digital converter is used. In some embodiments, the electronics also include a micro-mechanical (MEMS) switch for decoupling the coil during transmission. Alternatively, PIN diodes or another electronic decoupling switch are employed. The electronics 124', 124" can also include programmable digital logic for controlling various operative elements such as the pre-amplifier and the analog-to-digital converter circuit.

The radio frequency surface coil 44 is a generally planar surface coil rather similar to thin film coils formed by disposing a patterned copper film on a printed circuit board. The electrical conductors 72, 74, 76, 78 are preferably thin, for example having a thickness less than about five millimeters. The lithium ion or lithium polymer battery 100 of FIG. 3A is readily fabricated at such reduced thickness. Similarly, the ASICs 124, 124', 124" are typically fabricated on silicon or another semiconductor substrate and can readily fit into the thin substantially hollow electrical conductor 78. Some discrete components, such as the choke 122, may be too large to fit into the thin substantially hollow electrical conductor 78, in which case the conductor 78 can be made thicker, or, alternatively, these larger discrete elements can be disposed outside the on the substantially hollow electrical conductor 78 on the printed circuit board 70, optionally with separate shielding.

The electrical conductors 72, 74, 76, 78 can be made of copper or another conductive material. Alternatively the electrical conductors 72, 74, 76, 78 can be made of a thin insulating material, such as a plastic, with a few microns of metallization on the outer and inner surfaces. In the case of substantially hollow conductors 72, 78, the metallization is optionally omitted from the inside surfaces defining the hollow cavity. In such cases, electrical isolation of the battery, capacitor, electronics, or so forth inside the conductor 72, 78 is provided by the insulating material of the conductors 72, 78, so that separate insulation or insulative standoffs can optionally be omitted.

With reference to FIG. 6A, in one suitable approach for fabricating the substantially hollow electrical conductor 78 (or, equivalently, for fabricating the substantially hollow conductor 72) laminated copper or another laminated conductive material is laid down on the printed circuit board 70. After placement of the electronics 110, 110', 110" (not shown in FIG. 6A) on a selected area 781 of the laminated copper, a neighboring portion 782 of the laminated copper is delaminated from the printed circuit board 70 and folded over or wrapped around the electronics. The edges of the wrapped delaminated portion 782 is suitably sealed with the laminated portion 781 by a weld 783 or other suitable seal to form the substantially hollow conductor 78.

With reference to FIG. 6B, in another suitable approach for fabricating the substantially hollow electrical conductor 78 (or, equivalently, for fabricating the substantially hollow conductor 72), laminated copper or another laminated conductive material is laid down on the printed circuit board 70. After placement of the electronics 110, 110', 110" (not shown in FIG. 6B) on a selected area 784 of the laminated copper, a covering metal foil 785 or other covering electrically conductive foil is placed over the electronics. The edges of the covering metal foil 785 are suitably sealed to the copper laminate 784 by weld 786, 787 or other suitable seal to form the substantially hollow conductor 78.

Reception of the magnetic resonance signal generally occurs on the outside of the electrical conductors 72, 74, 76, 78. The penetration of the magnetic resonance signal into the electrical conductors 72, 74, 76, 78 is limited to the skin depth of the magnetic resonance signal in the conductor material. The skin depth is a few microns or a few tens of microns at typical magnetic resonance frequencies and for typical coil metals such as copper or aluminum, i.e. functions like a Faraday cage. Hence, the substantially hollow nature of the conductors 72, 78 typically does not strongly affect the radio frequency properties of the surface coil 44. Moreover, in the surface coil 44, the substantially hollow conductors 72, 78 are arranged in a symmetric fashion at opposite sides of the antenna, as shown in FIG. 2, thus reducing any asymmetry in radio frequency performance that might be introduced by the hollowed conductors. Still further, the conductors 74, 76 are optionally also made substantially hollow to further increase coil symmetry.

Analogously, the area within the metal foil covering 782, 785 can be filled with an electrolyte and electrode(s) and vacuum sealed or otherwise formed into a battery.

Figure 7A:
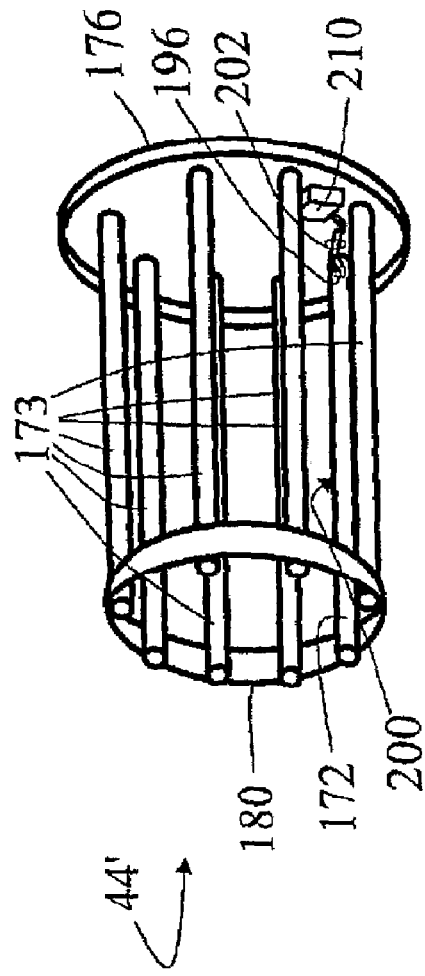
FIG. 7A shows an end-capped birdcage coil including a substantially hollow rung containing an integral battery.
Figure 7B:
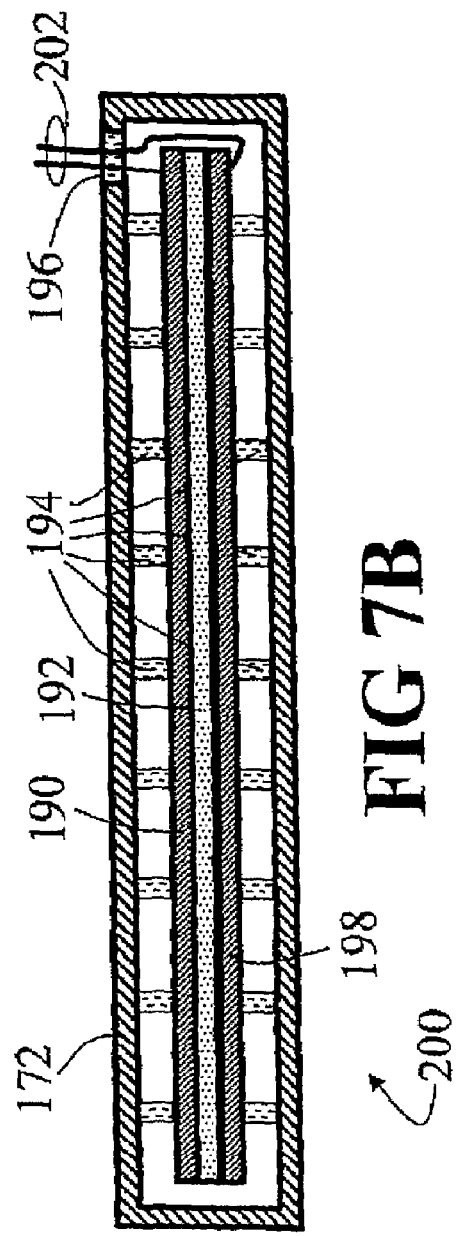
FIG. 7B shows a cross-section of the substantially hollow rung of the coil of FIG. 6A which contains the integral battery.

With reference to FIGS. 7A and 7B, another radio frequency coil 44' is described. The coil 44' is not a generally planar coil, but rather is an eight-rung end-capped birdcage coil. The coil 44' includes a plurality of generally tubular electrical conductors 172, 173 arranged generally parallel to one another and defining the coil rungs. An electrically conductive end cap 176 is disposed at one end of the parallel conductors 172, 173, and an electrically conductive ring 180 is disposed at the opposite end of the parallel conductors 172, 173. The eight rungs include seven tubular conductors 173 that can be either solid tubular conductors or hollow tubular conductors. Other numbers of rungs besides eight can also be used. In some birdcage embodiments, the end cap 176 is replaced by a second ring.

With continuing reference to FIG. 7A and with further reference to FIG. 7B, the eighth rung of the coil 44' is the tubular conductor 172, which is a hollow rung inside at least a portion of which is disposed first and second electrodes 190, 198 and an electrolyte 192. The electrodes 190, 198 are suitably spaced apart from the substantially hollow tubular electrical conductor 172 by a porous insulator drenched with the electrolyte 192, and are separated from the walls of the tubular conductor 172 by electrically insulating standoffs 194. An electrical storage battery 200 includes the electrodes 190, 198 and the electrolyte 192. The electrodes are optionally rolled-up or otherwise shaped, with the continuous electrolyte 192 providing separation, to increase surface area to volume ratio. Additionally, the electrodes can be roughened or made porous to provide increased surface area. In one embodiment, the battery 100 is a lithium polymer battery in which the electrolyte 192 has a semi-solid jelly or gel consistency. Electrical leads 202 contact the first and second electrodes 190, 198 through an electrically insulating feed through 196. As seen in FIG. 7A, the electrical leads 202 connect the battery 200 with a coil electronics module 210 disposed on the end cap 176. While the electronics module 210 is shown on an inside surface of the end cap 176, in some embodiments it is contemplated to; place the electronics module 210 on the outside surface, that is, away from the patient. Alternatively, the leads can extend though the hollow rungs, end ring, or end cap to electronics disposed in the hollow space. The coil electronics module 210 can have an RF cable, optical fiber, or wireless signal output.

The electronics module 210 of the coil 44' is disposed on the end cap 176 inside of a separate shielding box. Because it is disposed on the end cap 176, the effect of this separate shielding on the radio frequency characteristics of the coil 44' is typically small. However, it is also contemplated to dispose the coil electronics inside a hollowed out volume of one of the electrical conductors 172, a hollow end ring or a hollow end cap. thus eliminating the separate electronics shielding. Disposing the electronics inside a hollow rung is useful, for example, in birdcage coil designs which lack an end cap or other convenient surface for mounting separately shielded electronics.

The battery 200 is optionally a storage capacitor or a self-contained battery unit, such as the capacitor and battery examples shown in FIGS. 4A and 4B, respectively, and having a geometry that fits in the tubular space. In the case of a replaceable battery pack, the end of the substantially hollow tubular conductor 172 optionally includes a removable threaded or friction-fit cap that is removable to access and replace the battery pack. In another contemplated variation, more than one of the rungs can include a battery or other electrical power source, with the plurality of electrical power sources electrically connected in series, parallel, or another electrical arrangement to power the electronics module 210. Similarly, the battery and/or the coil electronics can be disposed in hollow regions of the end cap or the ring.

Figure 8:
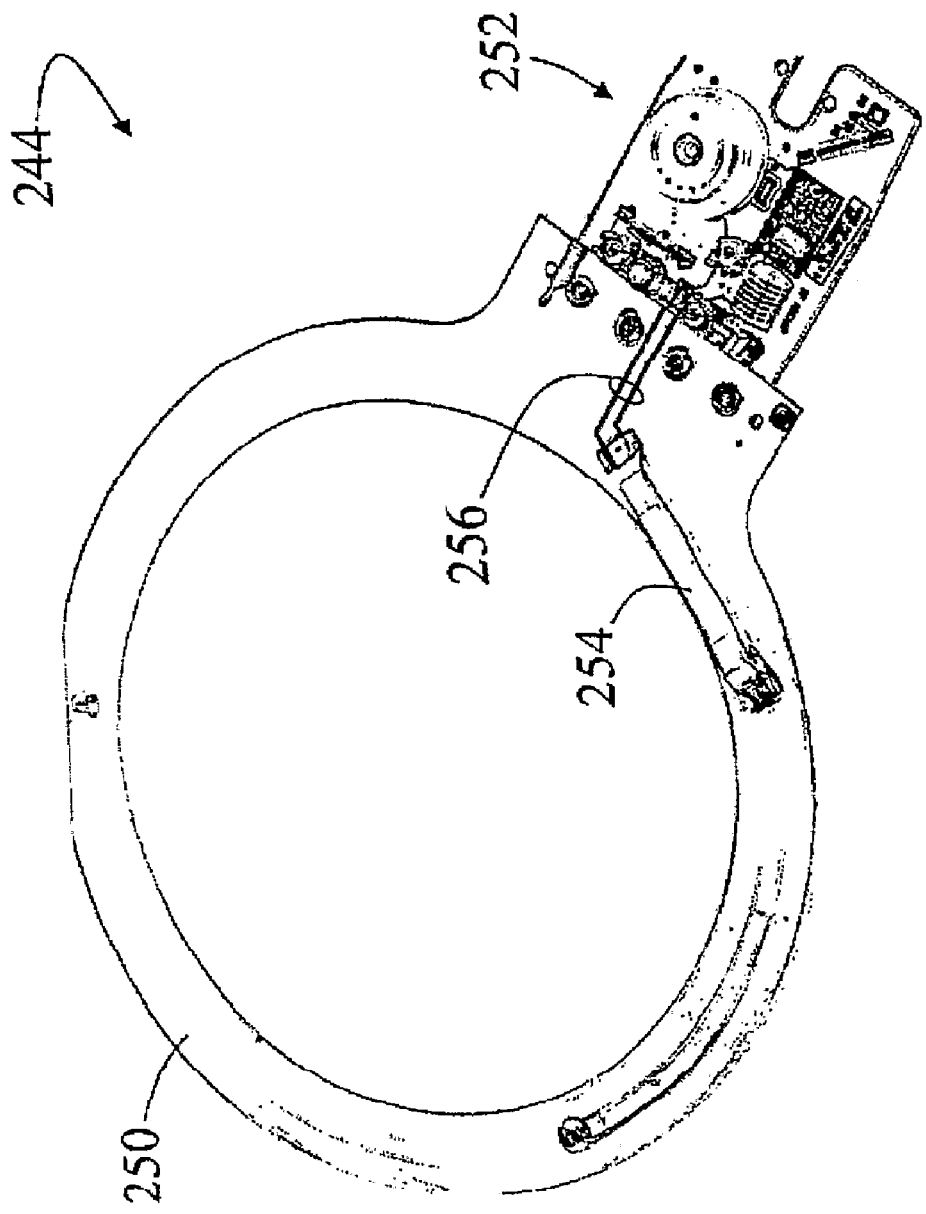
FIG. 8 shows a perspective view of a surface radio frequency receive coil including electronics disposed outside of the antenna conductors and a battery for driving the coil electronics secured to the radio frequency antenna loop.

With reference to FIG. 8, a radio frequency receive surface coil 244 includes an antenna loop 250 and electronics 252 coupled therewith. The electronics 252 are not contained within a conductor of the antenna loop 250. A battery 254 for driving the electronics 252 is secured to the surface coil 244. The battery 254 can be a lithium ion battery, a lithium polymer battery, a nickel-metal hydride battery, or the like, in which the battery 254 is made of non-magnetic materials. Placement of the battery 254 on top of the antenna loop 250 advantageously reduces eddy current distortion. Although the illustrated battery 254 has a straight battery housing, it will be appreciated that the battery can be curved to comport with the curvature of the antenna loop 250. Small surface traces 256 disposed on top of the antenna loop 250 and separated therefrom by an insulating layer, film, coating, or the like, connect the battery 254 with the electronics 252.

Figure 9:
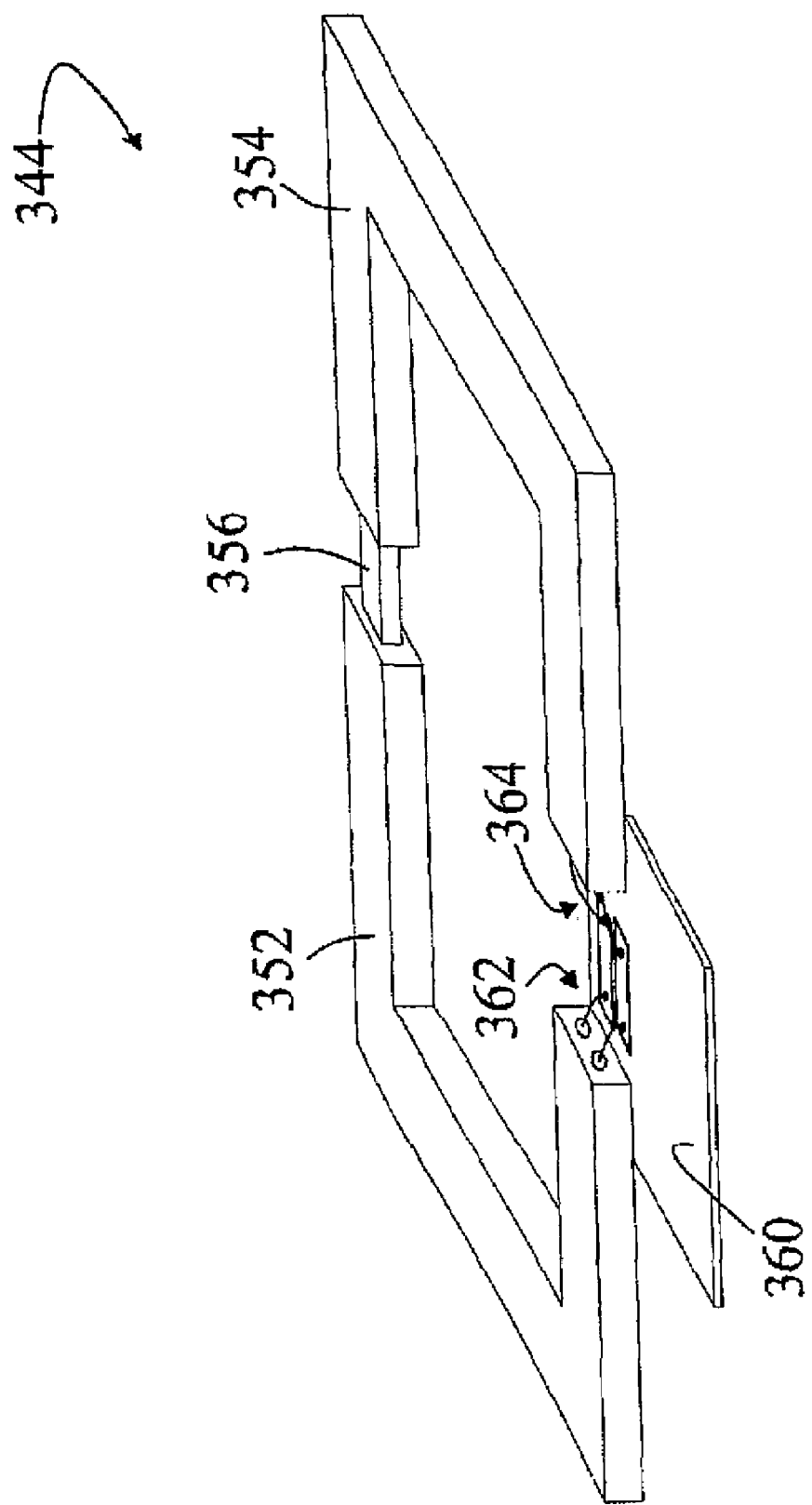
FIG. 9 shows a perspective view of a surface radio frequency receive coil including electronics disposed outside of the antenna conductors and two hollow conductors each containing a battery.

With reference to FIG. 9, a radio frequency receive surface coil 344 includes an antenna loop formed by two substantially hollow conductors 352, 354 connected by a capacitance 356. Electronics 360 coupled with the antenna loop are external from the substantially hollow conductors 352, 354. Each of the two substantially hollow conductors 352, 354 contains a battery. For example, each of the two substantially hollow conductors 352, 354 can contain a battery comporting with the cross-section shown in FIG. 3A. The battery in the conductor 352 includes two battery terminals 362 contacting with the electronics 360, while the battery in the conductor 352 includes two battery terminals 364 contacting with the electronics 360. By placing all four battery terminals 362, 364 proximate to the electronics 360, there is substantially no d.c. current flowing through the coil 344. Such a d.c. current typically produces distortion of the main $B_0$ magnetic field.

The use of two batteries, as shown in FIG. 9, is also advantageous. Besides providing more electrical power and/or higher voltage than a single battery, using two batteries allows power to be switched from one battery to the other in the event that the first operating battery becomes substantially discharged during an imaging procedure. Inclusion of additional batteries is also contemplated; for example, in the coil 44 illustrated in FIG. 2, three or all four conductors 72, 74, 76, 78 could be hollow and contain batteries. For batteries that are advantageously fully discharged before recharging, the electronics further include charge level sensors, switching systems for switching between batteries when one is substantially discharged, and charging circuitry that limits charging to the substantially discharged battery.

In high-throughput clinical magnetic resonance imaging environments, the recharging time of the batteries can become an issue. In one approach, the battery is removable so that a replacement battery can be quickly installed inside of the conductor. For example, the self-contained storage battery 160 of FIG. 4B is optionally removable, and the external battery 254 of FIG. 8 could be detachable. In embodiments where the conductor forms one electrode of the battery, removal becomes more difficult. It is contemplated to replace the conductor containing the integral battery; however, the replacement conductor may change the receive characteristics of the coil. Moreover, if the battery is removable and is recharged once removed from the coil, rapid recharging is still advantageous.

Suitable rapid battery recharging systems are described in Van Beek et al., International Publication WO 03/107505 A2 and in Van Beek et al., International Publication WO 03/107506 A2. These battery recharging systems use a boost charging concept employing high electrical current to provide a partial or complete recharging of the battery during the relatively brief time interval between imaging sessions. Moreover, these recharging methods generally do not degrade battery performance over time. Still further, the battery recharging systems of Van Beek can employ a radio frequency recharging current which can be transmitted using an RF-only transmission line. While the Van Beek recharging systems are suitable, those skilled in the art can employ other types of battery recharging systems and methods. Moreover, in some embodiments removable and disposable (i.e., non-rechargeable) batteries are used.

Rapid recharging approaches can also generally be employed with capacitive storage, such as the example storage capacitor 140 shown in FIG. 4A, since the charging of a capacitor does not involve electrochemical reactions and the internal resistance of a capacitor is typically low.

The example coils described herein include the generally planar surface coil 44, and the end-capped birdcage coil 44'. Those skilled in the art can readily adapt the techniques disclosed herein for integrating electrical power sources and shielding coil electronics in designing other types of receive coils. Moreover, a local transmit coil or local transmit/receive coil can similarly employ a battery and/or coil electronics disposed inside of or integrated with one or more substantially hollow electrical conductors of the coil.

It will also be appreciated that the term "substantially hollow conductor" or similar terms used herein refer to any conductor having an inner hollow volume sufficiently large to house the intended battery, storage capacitor, coil electronics, or other electrical component or components. For example, considering the substantially hollow electrical conductor 78 of FIG. 2, it may be sufficient for only one leg, or a portion of one leg, of this "L"-shaped conductor to be hollow in order to house the coil electronics. In this case, the other leg of the substantially hollow conductor 78 may also have a hollowed out volume, or may be filled without a hollowed-out region.

Still further, while batteries and storage capacitors are described herein, other electrical power sources can be disposed on a coil conductor or in a substantially hollow coil conductor. It is contemplated, for example, to employ a fuel cell contained, within a substantially hollow coil conductor for powering the wireless receive coil.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A radio frequency receive coil for receiving a magnetic resonance signal, the receive coil comprising:
   a radio frequency antenna including one or more electrical conductors; and
   at least one electrical component mounted to be shielded from interfering with the magnetic resonance signal by one of the electrical conductors, wherein at least one of the conductors is a substantially hollow conductor and the at least one electrical component is disposed inside the substantially hollow conductor, the substantially hollow conductor including a laminated conductive material laminated onto a printed circuit board and one of:
   (i) a portion of said laminated conductive material being delaminated from the printed circuit board and folded over the at least one electrical component to enclose said at least one electrical component, and
   (ii) the at least one electrical component being disposed on the laminated conductive material and a covering electrically conductive foil covering the at least one electrical component and sealed with the laminated conductive material to enclose said at least one electrical component.

2. The receive coil as set forth in claim 1, wherein the electrical conductors of the radio frequency antenna, including the at least one substantially hollow conductor, are generally planar conductors having thicknesses of less than about 5 millimeters.

3. The receive coil as set forth in claim 1, wherein the substantially hollow conductor includes:
   a laminated conductive material laminated onto a printed circuit board, a portion of said laminated conductive material being delaminated from the printed circuit board and folded over the at least one electrical component to enclose said at least one electrical component.

4. The receive coil as set forth in claim 1, wherein the substantially hollow conductor includes:
   a laminated conductive material laminated onto a printed circuit board, the at least one electrical component being disposed on the laminated conductive material; and
   a covering electrically conductive foil covering the at least one electrical component and sealed with the laminated conductive material to enclose said at least one electrical component.

5. The A radio frequency receive coil for receiving a magnetic resonance signal, the receive coil comprising:
   a radio frequency antenna including one or more electrical conductors, at least one of the electrical conductors being a substantially hollow conductor; and
   at least one electrical component mounted to be shielded from interfering with the magnetic resonance signal by being disposed inside the substantially hollow conductor, the at least one electrical component including an electrical power source and powering electronics for the radio frequency antenna wherein the electrical power source includes at least one of a rechargeable battery, a fuel cell, a storage capacitor, and a replaceable battery, disposed inside the substantially hollow conductor.

6. The receive coil as set forth in claim 5, wherein the electrical conductors of the radio frequency antenna including the at least one substantially hollow conductor include a plurality of tubular conductors.

7. The receive coil as set forth in claim 5, wherein the electrical power source includes:
   first and second electrodes disposed inside the substantially hollow conductor; and
   an electrolyte disposed inside the substantially hollow conductor, the electrolyte together with the electrodes defining a battery.

8. The receive coil as set forth in claim 7, wherein the battery includes at least one of:
   a lithium-polymer battery,
   a lithium-ion battery,
   a nickel-metalhalide battery; and
   a magnesium-metalhalide battery.

9. The receive coil as set forth in claim 5, wherein the powering electronics include:
   a circuit that (i) recharges the electrical power source and (ii) discharges the power source during the receiving of the magnetic resonance signal by the radio frequency receive coil.

10. The receive coil as set forth in claim 9, wherein the circuit recharges the electrical power source using one of:
    a battery recharging system selectively coupled with the radio frequency receive coil by an RU transmission line,
    a radio frequency signal produced by a radio frequency transmitter of an associated magnetic resonance imaging scanner, and
    a magnetic field gradient produced by magnetic field gradient coils of the associated magnetic resonance imaging scanner.

11. A radio frequency receive coil for receiving a magnetic resonance signal, the receive coil comprising:
- a radio frequency antenna including one or more electrical conductors, at least one of the electrical conductors being a substantially hollow conductor; and
- at least one electrical component mounted to be shielded from interfering with the magnetic resonance signal by being disposed inside the substantially hollow conductor, wherein the at least one electrical component includes coil electronics, the substantially hollow conductor Faraday shielding the coil electronics, wherein the coil electronics includes at least one of:
  - an electro-.optical component outputting a modulated optical signal corresponding to the received magnetic resonance signal,
  - a wireless transmitter that transmits a wireless signal corresponding to the received magnetic resonance signal,
  - an RF cable, and
  - battery recharging circuitry.

12. The receive coil as set forth in claim 11, wherein the coil electronics include at least one of:
- an electro-optical component outputting a modulated optical signal corresponding to the received magnetic resonance signal,
- a wireless transmitter that transmits a wireless signal corresponding to the received magnetic resonance signal, and
- an RF cable.

13. The receive coil as set forth in claim 11, wherein the at least one electrical component further includes:
- an electrical power storage component integrated with or disposed inside the at least one substantially hollow conductor of the radio frequency antenna, the electrical power storage component providing electrical power operating the coil electronics.

14. The receive coil as set forth in claim 11, wherein the coil electronics include at least one of:
- (i) a pre-amplifier,
- (ii) a radio frequency balun or trap for suppressing induced currents,
- (iii) detuning circuitry for detuning the coil during a radio frequency excitation operation, and
- (iv) safety interlock circuitry for deactivating the receive coil responsive to a control signal.

15. The receive coil as set forth in claim 11, wherein the coil electronics include battery recharging circuitry.

16. A radio frequency receive coil for receiving a magnetic resonance signal, the receive coil comprising:
- a radio frequency antenna including a plurality of electrical conductors, at least two of the electrical conductors being substantially hollow conductors; and
- electrical components mounted to be shielded from interfering with the magnetic resonance signal by being disposed inside the substantially hollow conductors, the at-least electrical components including:
- an electrical power source disposed in one of the hollow conductors; and
- coil electronics disposed in another of the hollow conductors, the electrical power source powering the coil electronics.

17. A radio frequency receive coil for receiving a magnetic resonance signal, the receive coil comprising:
- a radio frequency antenna including one or more electrical conductors; and
- at least one electrical component mounted to be shielded from interfering with the magnetic resonance signal by one of the electrical conductors;
- wherein the at least one electrical component includes:
  - two batteries;
  - battery recharging circuitry;
  - switching circuitry for connecting one battery with the coil and the other battery with the battery recharging circuitry; and
  - a battery state-of-charge sensor, the switching circuitry switching to another battery when the battery state-of-charge sensor indicates the operating battery is substantially fully discharged.

18. A magnetic resonance imaging scanner for imaging an imaging subject, the scanner comprising:
- a main magnet generating a substantially spatially and temporally constant magnetic field in an examination region;
- magnetic field gradient coils generating selected magnetic field gradients in the examination region; and
- a radio frequency receive coil comprising a radio frequency antenna including one or more electrical conductors and at least one electrical component mounted to be shielded from interfering with the magnetic resonance signal b one of the electrical conductors wherein the at least one electrical component includes a battery and the scanner further includes a battery recharging system selectively coupled with the radio frequency receive coil by an RF transmission line.

* * * * *